United States Patent [19]
Sato

[11] Patent Number: 6,062,460
[45] Date of Patent: May 16, 2000

[54] APPARATUS FOR PRODUCING AN ELECTRONIC CIRCUIT

[75] Inventor: Tomotoshi Sato, Nabari, Japan

[73] Assignee: Sharp Kabushiki Kaisha, Osaka, Japan

[21] Appl. No.: 08/971,985

[22] Filed: Nov. 17, 1997

[30] Foreign Application Priority Data

Nov. 27, 1996 [JP] Japan ................................. 8-316555

[51] Int. Cl.[7] .............................. B23K 31/00; B23K 1/00; B23K 1/08
[52] U.S. Cl. ............................. 228/119; 228/19; 228/36; 228/264
[58] Field of Search ............................. 228/180.22, 119, 228/33, 36, 125, 19, 264

[56] References Cited

U.S. PATENT DOCUMENTS

| | | | |
|---|---|---|---|
| 3,731,866 | 5/1973 | Mason et al. ................................. | 228/6 |
| 3,804,667 | 4/1974 | Halstead . | |
| 4,136,444 | 1/1979 | Durney ....................................... | 29/764 |
| 4,270,265 | 6/1981 | Ikeda et al. . | |
| 4,436,242 | 3/1984 | Shisler et al. ............................. | 228/264 |
| 4,441,647 | 4/1984 | Holmes ..................................... | 228/119 |
| 4,771,932 | 9/1988 | Kim ........................................ | 228/180.1 |
| 4,878,611 | 11/1989 | LoVasco et al. .......................... | 228/180.2 |
| 5,072,874 | 12/1991 | Bertram et al. ........................... | 228/264 |
| 5,154,793 | 10/1992 | Wojnarowski et al. ................... | 156/344 |
| 5,325,582 | 7/1994 | Glaser et al. .............................. | 29/840 |
| 5,402,563 | 4/1995 | Satoh et al. ................................ | 29/829 |
| 5,439,162 | 8/1995 | George et al. ........................ | 228/180.22 |
| 5,603,857 | 2/1997 | Mickle ..................................... | 219/228 |
| 5,758,817 | 6/1998 | Chapman ................................ | 228/264 |
| 5,783,025 | 7/1998 | Hwang et al. ........................... | 156/359 |

FOREIGN PATENT DOCUMENTS

| | | |
|---|---|---|
| 0266844A2 | 11/1987 | European Pat. Off. . |
| 0307574A1 | 7/1988 | European Pat. Off. . |
| 1209736 | 8/1989 | Japan . |
| 5299471 | 11/1993 | Japan . |
| 618433 | 1/1994 | Japan . |
| 7263450 | 10/1995 | Japan . |
| 846351 | 2/1996 | Japan . |
| 2259039A | 3/1993 | United Kingdom . |

*Primary Examiner*—Patrick Ryan
*Assistant Examiner*—Hiley Stoner

[57] ABSTRACT

A method for producing an electronic circuit device includes a repair step in which, in a case where a semiconductor device once mounted on a wiring board is defective, the defective semiconductor device is removed from the wiring board and a new semiconductor device is mounted on the wiring board. The repair step includes the steps of: removing an excessive residue of a brazing metal residue remaining on lands of the wiring board from which the defective semiconductor device has been removed and leaving a uniform amount of the brazing metal residue on the lands; aligning the new semiconductor device with the wiring board; and melting the brazing metal residue which is made uniform and remains on the lands and projecting electrodes of the new semiconductor device by heating, thereby connecting the new semiconductor device to the wiring board.

20 Claims, 12 Drawing Sheets

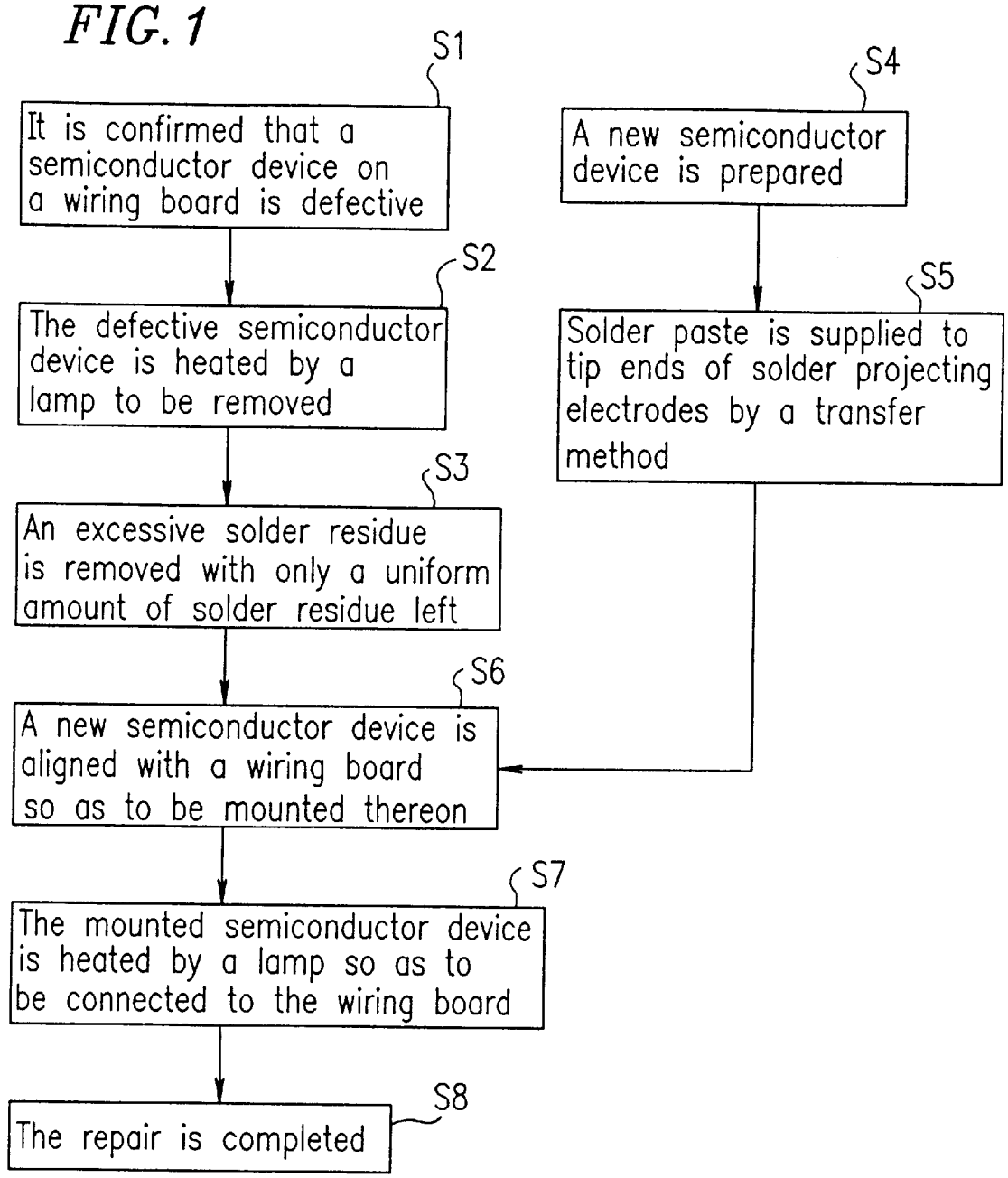

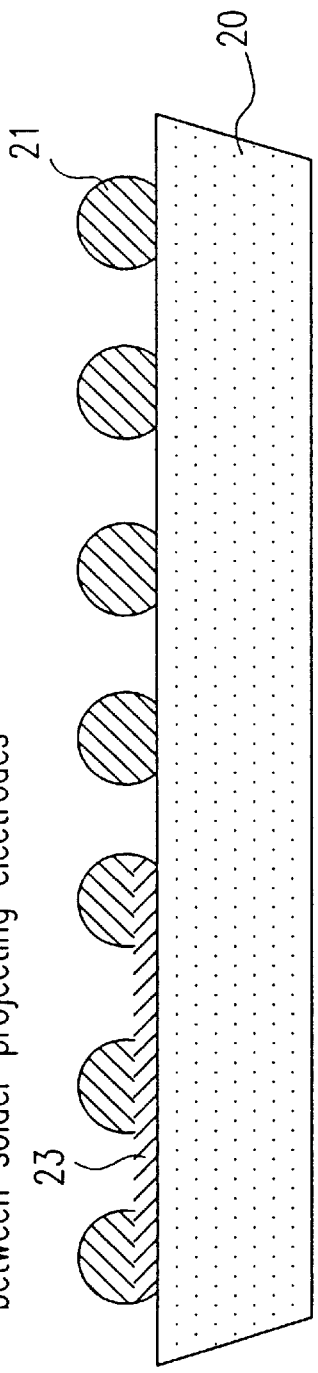
FIG. 3A Solder paste adheres to a semiconductor device to form a bridge between solder projecting electrodes
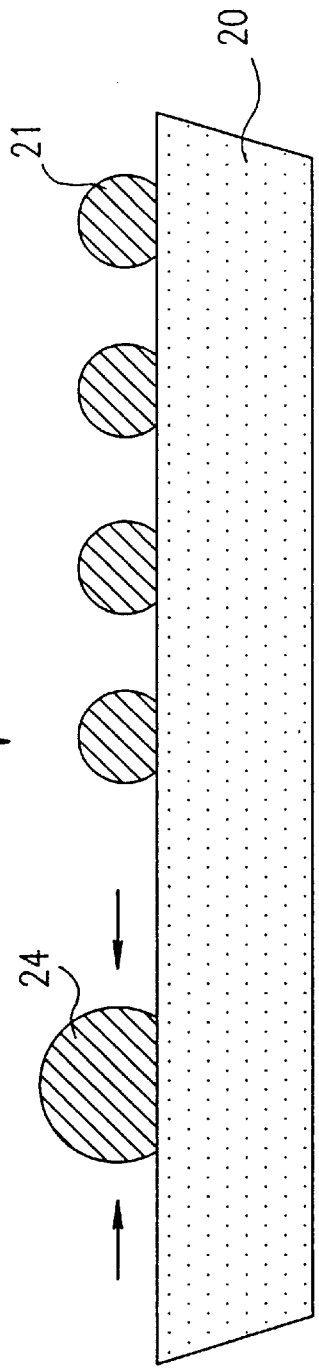
FIG. 3B The bridge and the solder projecting electrodes are integrated due to the surface tension Connected state

PRIOR ART

APPARATUS FOR PRODUCING AN ELECTRONIC CIRCUIT

BACKGROUND OF THE INVENTION

1. Field of the Invention

The present invention relates to a method for producing an electronic circuit device including a repair step in which, in the case where a semiconductor device once mounted on a substrate is defective, the defective semiconductor device is removed therefrom, and a new semiconductor device is mounted thereon; a jig for making a solder residue uniform and a jig for transferring a brazing metal paste used in the production method; and an apparatus for producing an electronic circuit device used for performing the production method.

2. Description of the Related Art

During the above-mentioned repair step, when a defective semiconductor device (electronic component) is removed from a wiring board (i.e., substrate for mounting a semiconductor device), a solder residue, for example, made of brazing metal remains on connecting portions (i.e., lands) of the wiring board. Since the height of the solder residue is not uniform, when a new semiconductor device is mounted on the wiring board in this state, a connection failure may occur, leading to disconnection or the like.

According to the conventional repair method, in order to prevent the connection failure, the following steps (1) and (2) have been performed.

(1) First, a solder-wettable metal plate (i.e., a metal plate over which solder can spread well) is pressed against a solder residue and heated in this state so that the solder residue adheres to the metal plate, whereby the solder residue on the wiring board is completely removed.

(2) A flux is coated onto lands of the wiring board for the purpose of preventing the lands from being oxidized. Solder projecting electrodes of a semiconductor device to be newly mounted melt by heating in an atmosphere furnace or in an air-oven, whereby the semiconductor device is connected to the wiring board.

For example, Japanese Laid-open Publication Nos. 1-209736 and 8-46351 disclose conventional examples as described above.

In the case where a semiconductor device is bonded to a wiring board, using solder projecting electrodes by flip chip bonding, when there is a difference in thermal expansion coefficient between the semiconductor device and the wiring board, there is the following problem. The difference between the temperature at which the solder projecting electrodes melt by heating and room temperature, or the difference between the temperature during operation of the semiconductor device and the temperature when the semiconductor device is not being operated causes a difference in expansion and contraction between the semiconductor device and the wiring board (i.e., thermal stress). This may strain connecting portions of the solder projecting electrodes to induce a connection failure. Thus, strain on the connecting portions of the solder projecting electrodes caused by the difference in thermal expansion coefficients of the parts decreases the reliability of a product.

In the case where nothing fills between the semiconductor device and the wiring board, the strain of the connecting portions of the solder projecting electrode is in good agreement with a value calculated from the Coffin·Manson connection fatigue life expression represented by the following Formulae (1) and (2). In order to decrease the maximum strain $\gamma_{max}$ in the connecting portions, as is understood from Formula (2), the height $H_j$ of the connecting portions should be increased. For this purpose, the amount of solder is increased.

$$Nf = C \cdot f^{1/3} \cdot 1/\gamma_{max}^2 \cdot \exp(\Delta E/KT_{max}) \quad (1)$$

$$\gamma_{max} = 1/(D_{min}/2)^{2/\beta} \cdot (V_j/\pi \cdot H_j^{(1+\beta)})^{1/\beta} \cdot \Delta T \cdot \Delta \alpha \cdot d \quad (2)$$

where $N_f$: number of cycles until a connection failure occurs
C: proportionality factor
$\beta$: solder material constant
K: Boltzmann's constant
f: frequency of temperature cycle
$T_{max}$: maximum temperature of temperature cycle
$D_{min}$: minimum diameter of connecting portions (i.e., smaller value of upper and lower diameters $D_{B1}$ and $D_{B2}$ of connecting portions in FIG. 13)
$\Delta\alpha$: difference in thermal expansion coefficient between wiring board and semiconductor device
d: distance between focused solder joint and the neutral point of thermal stress
$\Delta E$: activating energy leading to fatigue For reference, FIG. 13 illustrates representative elements among those shown above.

As described above, according to the conventional repair method, the solder residue is completely removed, and the semiconductor device is connected to the wiring board by using the solder in the solder projecting electrodes alone. Therefore, the amount of solder is small. This makes it impossible to increase the height $H_j$ of the connecting portions so as to improve the reliability of the product.

SUMMARY OF THE INVENTION

A method for producing an electronic circuit device of the present invention includes a repair step during a process of producing an electronic circuit device by aligning projecting electrodes made of brazing metal and formed on one principal plane of a semiconductor device with a substrate for mounting a semiconductor device having lands for connection corresponding to the projecting electrodes, and melting the projecting electrodes by heating, thereby mounting the semiconductor device on the substrate. The repair step includes, in a case where the semiconductor device once mounted is defective, removing the defective semiconductor device from the substrate and mounting a new semiconductor device on the substrate. The repair step includes the steps of: removing an excessive residue of a brazing metal residue remaining on the lands of the substrate from which the defective semiconductor device has been removed and leaving a uniform amount of the brazing metal residue on the lands; aligning the new semiconductor device with the substrate; and melting the brazing metal residue which is made uniform and remains on the lands and projecting electrodes of the new semiconductor device by heating, thereby connecting the new semiconductor device to the substrate.

Alternatively, a method for producing an electronic circuit device of the present invention includes a repair step during a process of producing an electronic circuit device by aligning projecting electrodes made of brazing metal and formed on one principal plane of a semiconductor device with a substrate for mounting a semiconductor device having lands for connection corresponding to the projecting electrodes, and melting the projecting electrodes by heating, thereby mounting the semiconductor device on the substrate.

The repair step includes, in a case where the semiconductor device once mounted is defective, removing the defective semiconductor device from the substrate and mounting a new semiconductor device on the substrate. The repair step includes the steps of: removing an excessive residue of a brazing metal residue remaining on the lands of the substrate from which the defective semiconductor device has been removed and leaving a uniform amount of the brazing metal residue on the lands; supplying brazing metal paste to tip ends of projecting electrodes of the new semiconductor device; aligning the new semiconductor device with the substrate; and melting the brazing metal residue which is made uniform and remains on the lands, projecting electrodes of the new semiconductor device, and the brazing metal paste by heating, thereby connecting the new semiconductor device to the substrate.

In one embodiment of the present invention, the uniform amount of the brazing metal residue remaining on the lands has a height corresponding to surface tension of the brazing metal residue.

In another embodiment of the present invention, the brazing metal residue which is made uniform and remains on the lands and the projecting electrodes of the new semiconductor device are heated to melt with light emitted by a lamp.

In another embodiment of the present invention, a near-infrared lamp is used as the lamp.

In another embodiment of the present invention, the step of removing an excessive residue of a brazing metal residue remaining on the lands of the substrate from which the defective semiconductor device has been removed and leaving a uniform amount of the brazing metal residue on the lands is performed by placing a plate made of solder-wettable metal over the brazing metal residue with a predetermined gap kept therebetween and heating the plate.

In another embodiment of the present invention, the predetermined gap is about ¼ to about ¹/₁₀ of a land diameter of the lands.

In another embodiment of the present invention, the step of removing an excessive residue of a brazing metal residue remaining on the lands of the substrate from which the defective semiconductor device has been removed and leaving a uniform amount of the brazing metal residue on the lands is performed by a heating iron which moves at a predetermined speed while keeping in contact with the brazing metal residue.

In another embodiment of the present invention, in a case where the land diameter of the lands is about 150 μmφ to about 800 μmφ, the heating iron is moved manually.

In another embodiment of the present invention, in a case where the land diameter of the lands is about 150 μmφ to about 550 μmφ, the heating iron is moved manually.

In another embodiment of the present invention, the brazing metal is eutectic solder or solder whose strength is increased by adding a slight amount of additive to eutectic solder.

In another embodiment of the present invention, the semiconductor device is a semiconductor package having projecting electrodes in an area-array.

In another embodiment of the present invention, the step of supplying the brazing metal paste to the tip ends of the projecting electrodes is performed by a transfer method.

In another embodiment of the present invention, the brazing metal paste is obtained by dispersing metal powders which are the same kind as that of brazing metal in a binder.

In another embodiment of the present invention, the projecting electrodes of the new semiconductor device and the brazing metal paste are heated to melt with light emitted by a lamp.

According to another aspect of the present invention, a jig for making a solder residue uniform used for producing an electronic circuit device includes a plurality of pins on an outer peripheral portion of the plate.

Alternatively, in a jig for transferring brazing metal paste to tip ends of projecting electrodes of a semiconductor device in a method for producing an electronic circuit device, a groove in a shape of an expanding slot or a circular concave groove is formed in a center portion of the jig, and a depth of the groove is prescribed to be about ⅓ to about ½ of a height of the projecting electrodes of the semiconductor device.

According to another aspect of the present invention, in an apparatus for producing an electronic circuit device by aligning projecting electrodes made of brazing metal and formed on one principal plane of a semiconductor device with a substrate for mounting a semiconductor device having lands for connection corresponding to the projecting electrodes, and melting the projecting electrodes by heating, thereby mounting the semiconductor device on the substrate, in a case where the semiconductor device once mounted is defective, the defective semiconductor device is removed from the substrate and a new semiconductor device is mounted on the substrate. The apparatus includes: a holder holding the substrate; a holder holding the defective semiconductor device or the new semiconductor device; an alignment unit aligning the substrate with the defective semiconductor device or the new semiconductor device; a unit removing an excessive residue of a brazing metal residue remaining on connecting portions of the substrate from which the defective semiconductor device has been removed and leaving a uniform amount of the brazing metal residue corresponding to surface tension of the brazing metal residue on the connecting portions; and a heating unit melting the projecting electrodes of the aligned new semiconductor device by heating, thereby connecting the new semiconductor device to the substrate.

Alternatively, in an apparatus for producing an electronic circuit device by aligning projecting electrodes made of brazing metal and formed on one principal plane of a semiconductor device with a substrate for mounting a semiconductor device having lands for connection corresponding to the projecting electrodes, and melting the projecting electrodes by heating, thereby mounting the semiconductor device on the substrate, in a case where the semiconductor device once mounted is defective, the defective semiconductor device is removed from the substrate and a new semiconductor device is mounted on the substrate. The apparatus includes: a holder holding the substrate; a holder holding the defective semiconductor device or the new semiconductor device; an alignment unit aligning the substrate with the defective semiconductor device or the new semiconductor device; a unit removing an excessive residue of a brazing metal residue remaining on connecting portions of the substrate from which the defective semiconductor device has been removed and leaving a uniform amount of the brazing metal residue corresponding to surface tension of the brazing metal residue on the connecting portions; a jig for transferring brazing metal paste to tip ends of the projecting electrodes of the new semiconductor device, a groove in a shape of an expanding slot or a circular concave groove being formed in a center portion of the jig, and a depth of the groove being prescribed to be about ⅓ to about ½ of a height of the projecting electrodes of the semiconductor device; and a heating unit melting the projecting electrodes of the aligned new semiconductor device by heating, thereby connecting the new semiconductor device to the substrate.

In one embodiment of the present invention, the unit removing an excessive residue of a brazing metal residue remaining on connecting portions of the substrate from which the defective semiconductor device has been removed and leaving a uniform amount of the brazing metal residue on the connecting portions is a heating iron which moves at a predetermined speed while keeping in contact with the brazing metal residue or a jig for making a solder residue uniform including a plurality of pins on an outer peripheral portion.

In another embodiment of the present invention, the heating unit is a near-infrared lamp.

Hereinafter, the function of the present invention will be described.

As described above, only a uniform amount of solder residue in accordance with the surface tension of the solder is left, and a new semiconductor device is provided with solder paste by a transfer step. Therefore, a sufficient amount of solder can be secured for a repaired semiconductor device. As is understood from the Coffin·Manson connection fatigue life expression, this increases the height $H_j$, of the connecting portions and decreases the maximum strain $\gamma_{max}$ in the connecting portions, so that a connection failure (i.e., disconnection) does not occur. Thus, the reliability of the semiconductor device can be improved.

Depending upon the kinds of products (i.e., kinds of semiconductor devices and wiring boards to be connected), the transfer step as described above is not required. According to the experimental result of the inventors of the present invention, for example, in the case where a semiconductor device having a land pitch $L_P$, of about 0.6 mm is mounted on a wiring board having a land diameter $L_D$ of about 200 $\mu m\phi$, the height of the printed solder (i.e., height of the solder residue after being shaped) is about 70 $\mu m\phi$. Therefore, it was confirmed that a reliable semiconductor device may be obtained without performing a transfer step.

According to the present invention, the solder residue remaining on a wiring board from which a defective semiconductor device has been removed is left on purpose, instead of being completely removed, whereby a sufficient amount of solder is secured. In this case, the solder residue remaining on the wiring board from which the defective semiconductor device has been removed is left in a nonuniform amount. However, by utilizing the surface tension of the molten solder, the solder residue can be controlled to a uniform amount and a uniform height. This control can be easily performed by heating the solder residue by using the above-mentioned jig for making the solder residue uniform.

According to the transfer method, a uniform amount of solder paste can be easily supplied to a semiconductor device, which is convenient. More specifically, the use of the above-mentioned jig for transferring brazing metal paste facilitates the transfer of solder paste.

In accordance with the Coffin·Manson connection fatigue life expression, in order to increase the height of the connecting portions, solder paste should be transferred as much as possible. Considering the relationship between the amount of the solder residue remaining on the wiring board and the surface tension thereof, the transfer amount is preferably about ⅓ or more of the height of the solder projecting electrodes. If too great an amount of solder paste is transferred, as shown in FIG. 3A (described later), solder paste 12 may adhere to a semiconductor device 20 to form a bridge 23 between solder projecting electrodes 21. When such a bridge 23 is formed, as shown in FIG. 3B, the bridge 23 reflows together with the solder projecting electrodes 21 when the semiconductor device 20 is mounted and heated. Then, the molten solder is integrated due to its surface tension, forming a solder projecting electrode 24 with a large diameter. In order to prevent such a solder projecting electrode from being formed, the transfer amount should be limited to about ½ of the height of the solder projecting electrodes 21, i.e., a value not exceeding an equator surface of the solder projecting electrodes 21.

According to the present invention, the depth of the groove of the jig for transferring brazing metal paste is prescribed to be about ½ to about ⅓ of the height of the solder projecting electrodes, whereby the transfer amount is prescribed to be about ½ to about ⅓ of the height of the solder projecting electrodes 21.

A heating device for re-connecting a new semiconductor device to a wiring board should not involve an excessive external force. More specifically, without an excessive external force, a semiconductor device and a wiring board which have been aligned with each other will not be shifted in position. Thus, the repair step can be more easily and efficiently performed. Because of this, according to the present invention, a lamp which does not involve an external force is used. As the lamp, a near-infrared lamp (IR lamp) is preferably used for the following reason. In a semiconductor device, Si is used as a material mainly for a circuit board. Si transmits light in a near-infrared region (wavelength: about 1 to about 5 $\mu m$). When the light with a wavelength of about 1 to about 5 $\mu m$ is used, the light passes through Si to directly and efficiently heat the solder projecting electrodes and solder paste. Thus, an IR lamp capable of emitting light with a wavelength of about 1 to about 5 $\mu m$ is preferably used.

The use of eutectic solder or eutectic solder with a slight amount of additive added thereto as brazing metal can improve solder strength.

Thus, the invention described herein makes possible the advantages of: (1) providing a method for producing an electronic circuit device which is capable of securing the amount of solder sufficient for connecting a semiconductor device to a wiring board, thereby increasing the height of the connecting portions to improve the reliability of a product; (2) providing a jig for making a solder residue uniform and a jig for transferring a brazing metal paste used in the production method; and (3) providing an apparatus for producing an electronic circuit device used for performing the production method.

These and other advantages of the present invention will become apparent to those skilled in the art upon reading and understanding the following detailed description with reference to the accompanying figures.

BRIEF DESCRIPTION OF THE DRAWINGS

FIG. 1 is a flow chart showing a repair process in a method for producing an electronic circuit device according to the present invention.

FIGS. 3A and 3B illustrate inconvenience in the case where the amount of transfer paste is excessive.

DESCRIPTION OF THE PREFERRED EMBODIMENTS

Figure 2A:
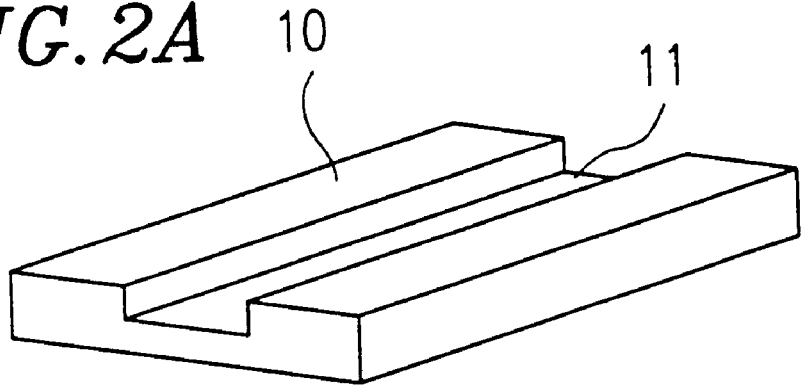
FIG. 2A is a perspective view showing a jig for transferring solder paste used for performing the method according to the present invention.

The present invention will be described by way of illustrative embodiments with reference to the drawings.

Embodiment 1

FIGS. 1 through 7 show a method for producing an electronic circuit device in Embodiment 1 according to the present invention. The method according to the present invention is characterized by a repair step which will be outlined with reference to FIG. 1.

First, at Step S1, it is confirmed that a semiconductor device on a wiring board is defective. At Step S2, the defective semiconductor device is heated by a lamp so as to melt solder projecting electrodes, whereby the semiconductor device is removed from the wiring board.

At Step S3, after the defective semiconductor device is removed, an excessive solder residue remaining on the wiring board is removed so that only a uniform amount thereof is left.

At Step S4, a new semiconductor device is prepared. At Step S5, solder paste is provided by a transfer method to tip ends of solder projecting electrodes of the device, whereby the device is ready to be mounted.

At Step S6, the new semiconductor device to which the solder paste has been transferred is aligned with the wiring board on which a uniform amount of solder residue remains.

At Step S7, the new semiconductor device which has been mounted on the wiring board is heated by a lamp, whereby the solder projecting electrodes and the solder paste melt. Thus, the semiconductor device is connected to the wiring board. At Step S8, the repair is completed.

During the repair step, a near-infrared lamp (IR lamp) is preferably used for the following reason. As a material of choice for wiring boards, Si is used. Si transmits light in a near-infrared region (wavelength: about 1 to about 5 $\mu$m). When the light with a wavelength of about 1 to about 5 $\mu$m is used, the light passes through Si to directly heat the solder projecting electrodes and solder paste with efficiency. Thus, the IR lamp which emits light with a wavelength of about 1 to about 5 $\mu$m is preferable.

The step of transferring solder paste at Step 5 is performed, for example, by using a solder paste transfer jig 10 shown in FIG. 2. The jig 10 is a rectangular solid which has a groove 11 in the shape of an expanding slot at a center portion of its surface. The groove 11 is provided for the purpose of allowing solder paste 12 to have constant thickness. It is appropriate that the depth of the groove 11 is about ½ to about ⅓ of the height of solder projecting electrodes 21 of a semiconductor device 20 (see FIG. 3) for the following reason.

According to the above-mentioned Coffin·Manson connection fatigue life expression, in order to increase the height of the connecting portions, the solder paste 12 may be transferred as much as possible. Considering the relationship between the amount of a solder residue remaining on the wiring board and the surface tension thereof, the depth of the groove 11 is preferably at least about ⅓ of the height of the solder projecting electrodes 21. When the transfer amount is excessive, there is a possibility that the solder paste 12 may adhere to a semiconductor device 20 to form a bridge 23 between the solder projecting electrodes 21, as shown in FIG. 3A. When such a bridge 23 is formed, as shown in FIG. 3B, the bridge 23 reflows together with the solder projecting electrodes 21 when the semiconductor device 20 is mounted and heated. Then, the molten solder is integrated due to its surface tension, forming a solder projecting electrode 24 with a large diameter. In order to prevent such inconvenience, the transfer amount should be set at about ½ of the height of the solder projecting electrodes 21, i.e., at a value not exceeding an equator surface of the solder projecting electrodes 21.

In Embodiment 1, the depth of the groove 11 of the jig 10 is set to be about ½ to about ⅓ of the height of the solder projecting electrodes 21, whereby the transfer amount is set to be about ½ to about ⅓ of the height of the solder projecting electrodes 21.

Figure 4A:
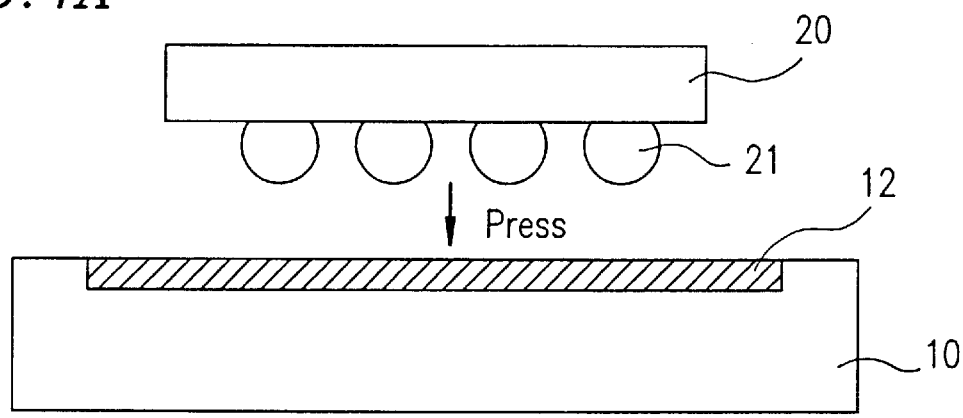
FIGS. 4A and 4B show steps of transferring solder paste.
Figure 4B:
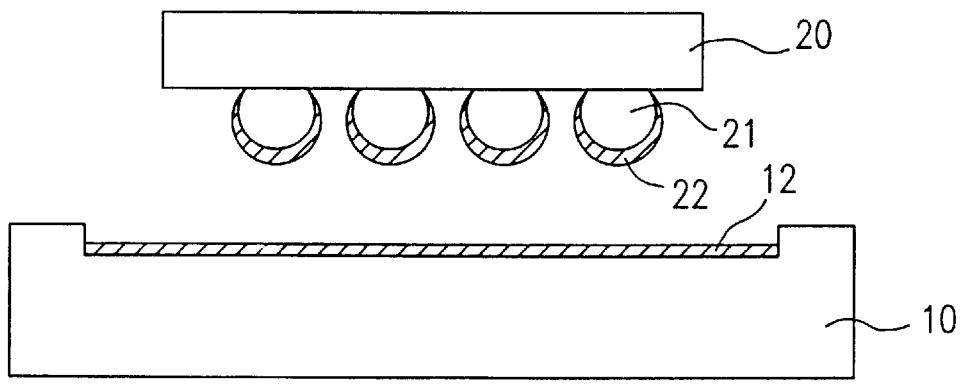

Next, referring to FIGS. 4A and 4B, the step of transferring solder paste using the jig 10 will be described in detail.

First, the solder paste 12 is put in the groove 11 of the jig 10, and the surface of the solder paste 12 is flattened out by a squeegee or the like (not shown) so that the groove 11 is filled with the solder paste 12. Thereafter, the semiconductor device 20 is pressed against the jig 10 (see FIG. 4A), whereby the solder paste 12 is allowed to adhere to the tip ends of the solder projecting electrodes 21. The semiconductor device 20 is lifted up. Thus, the step of transferring the solder paste 12 is completed (see FIG. 4B). Element 22 is solder which is attached to the projecting electrodes 21.

Figure 5A:
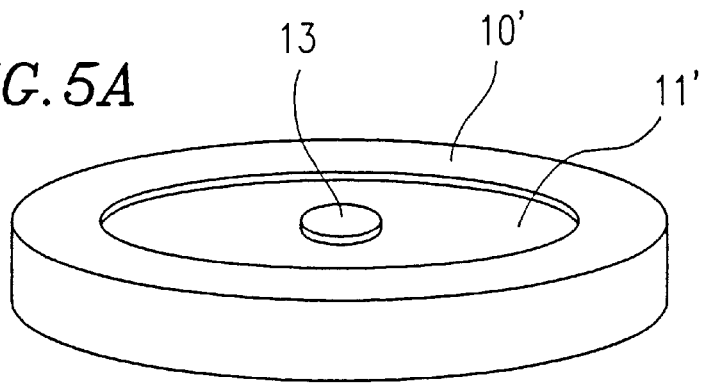
FIG. 5A is a perspective view showing another jig for transferring solder paste used for performing the method according to the present invention.
Figure 5B:
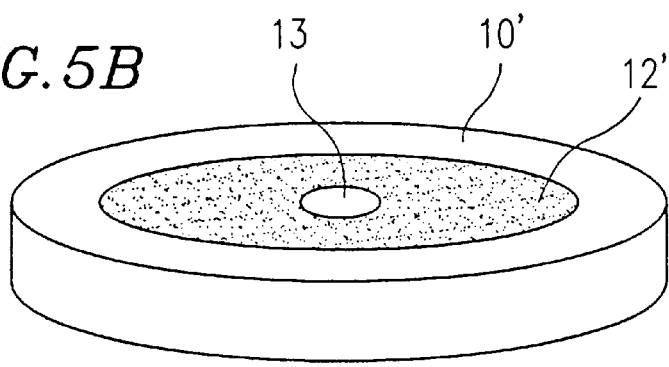
FIG. 5B is a perspective view showing a state in which the jig is filled with transfer paste.

FIGS. 5A and 5B show another example of a solder paste transfer jig. A jig 10' is in the shape of a disk which has a circular groove 11' in a center portion. A projection 13 whose surface is as high as the surface of the jig 10' is disposed in a center portion of the circular groove 11'. The depth of the groove 11' is set to be about ½ to about ⅓ of the height of the solder projecting electrodes 21 in the same way as the above.

Figure 6:
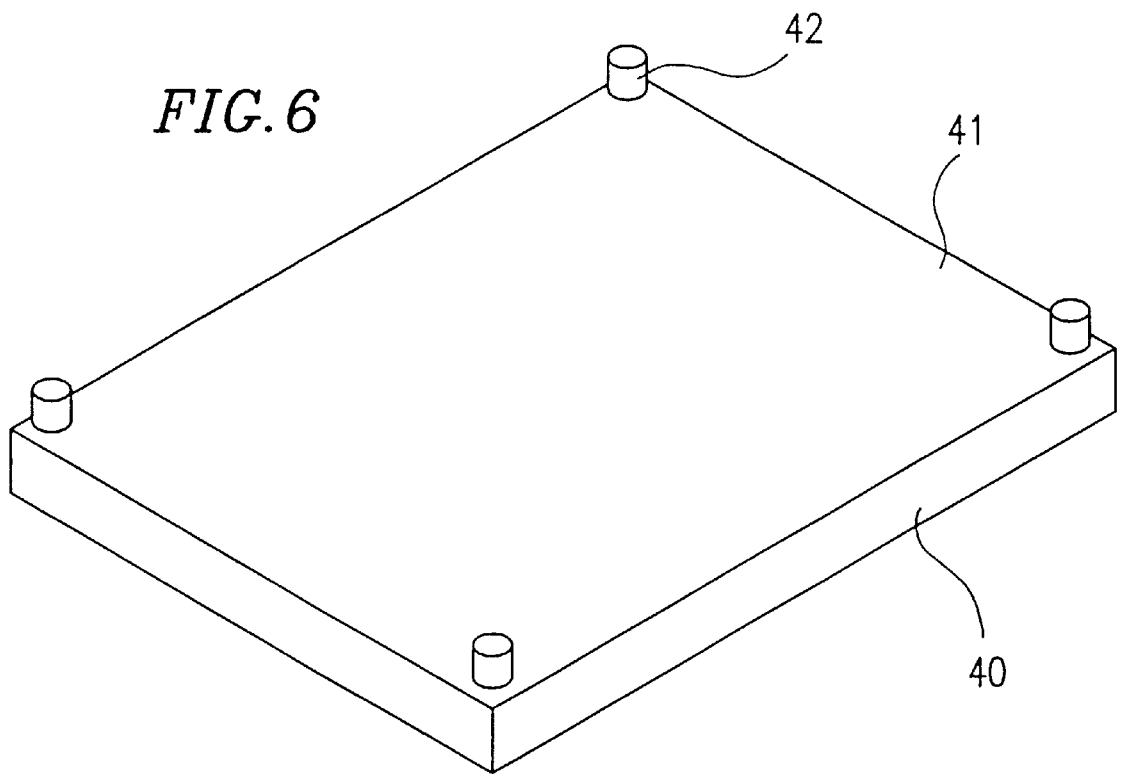
FIG. 6 is a perspective view showing a jig for making a solder residue uniform.

FIG. 6 shows a jig for making the amount of the solder residue on the wiring board uniform at Step 3. A jig 40 is composed of a solder-wettable metal plate 41 in the shape of a rectangular solid provided with pins 42 at four corners. The pins 42 have the function of keeping a constant gap with respect to a wiring board 30 (see FIG. 7).

Figure 7A:
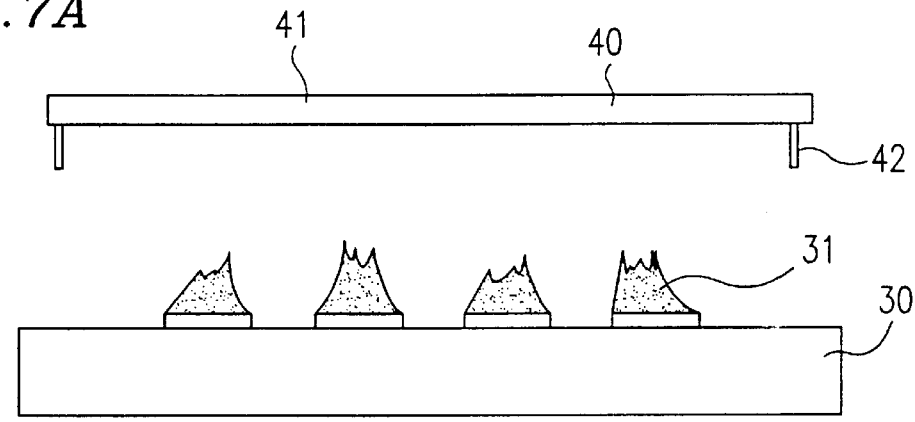
FIGS. 7A through 7C show steps of making a solder residue on a wiring board uniform using the jig shown in FIG. 6.

Next, the step of making a solder residue 31 on the wiring board 30 uniform by using the jig 40 will be described with reference to FIGS. 7A through 7C. As shown in FIG. 7A, the jig 40 is pressed against the wiring board 30 from which a defective semiconductor device has been removed, with the pins 42 facing downward. In this condition, the jig 40 is heated. The solder residue 31 on the wiring substrate 30 melts and spreads over the metal plate 41 (see FIG. 7B).

Figure 7B:
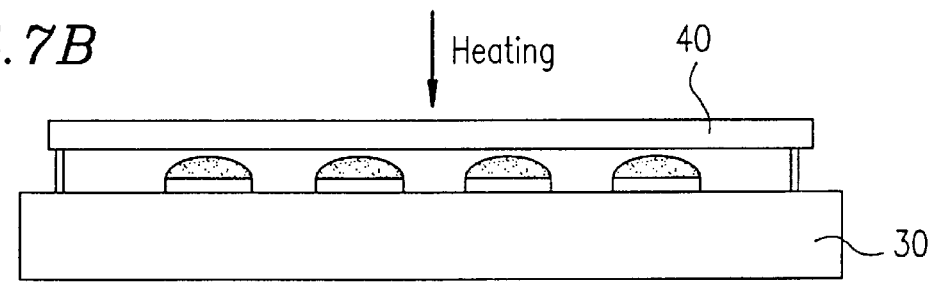
Figure 7C:
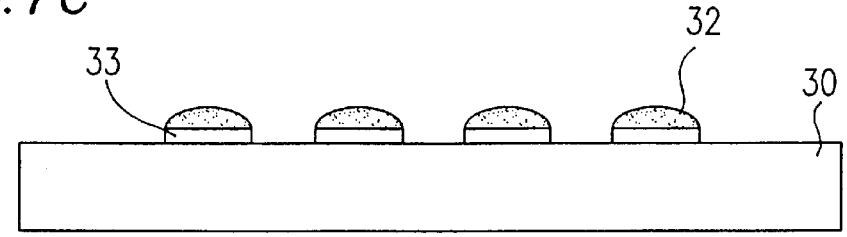

In FIG. 7B, for simplicity, the solder residue spreading over the metal plate 41 is not shown. Due to the surface tension of the solder, the solder stops spreading over the jig 40, with a predetermined amount of solder remaining on lands 33 for connection of the wiring board 30. At this time, if required, a flux or the like may be coated on the jig 40 or the wiring board 30. Thereafter, the jig 40 is removed, and a uniform amount of solder 32 remains on the lands 33 of the wiring board 30 (see FIG. 7C).

In order to make the solder residue 31 uniform by utilizing the surface tension of the solder, the height of the pins 42 is important. It has been confirmed that the height of the pins 42 is preferably about ¼ to about 1/10 of the diameter of the lands 33.

As a semiconductor device to which the present invention is applied, a semiconductor package having solder projecting electrodes in an area array is used.

Embodiment 2

Figure 8A:
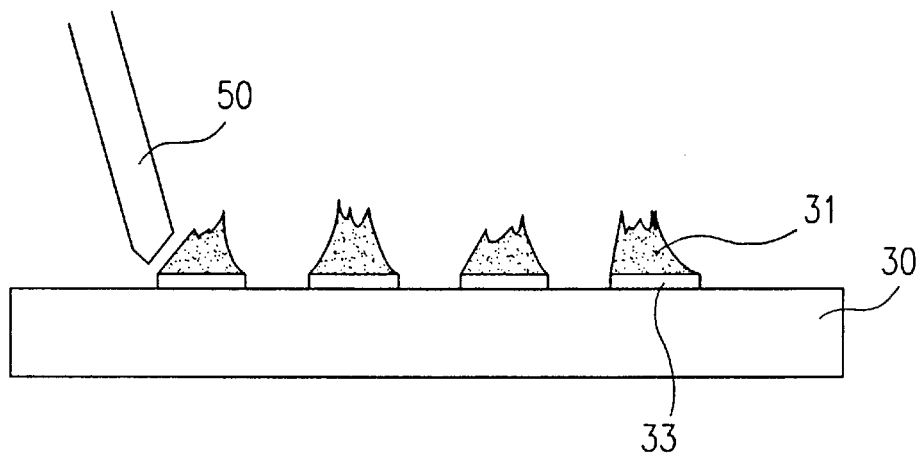
FIGS. 8A through 8C show steps of making a solder residue uniform using another jig for making a solder residue uniform.
Figure 8B:
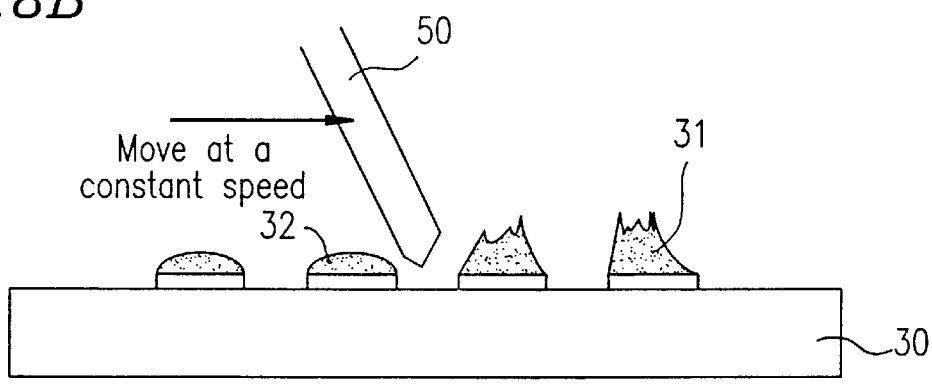
Figure 8C:
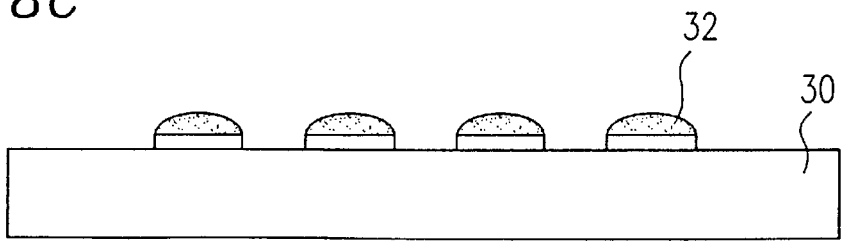

FIGS. 8A through 8C show a method for producing an electronic circuit device in Embodiment 2 according to the present invention. Embodiment 2 is characterized by a method for making a solder residue uniform during a repair step. In Embodiment 2, the solder residue is made uniform by using a soldering iron. The step of making the solder residue uniform will be described in detail.

First, as shown in FIG. 8A, a soldering iron 50 is positioned above a wiring board 30. More specifically, the soldering iron 50 is positioned at such a height that its tip end can come into contact with the solder residue 31.

Next, as shown in FIG. 8B, the heated soldering iron 50 is moved in the horizontal direction at a constant speed. Herein, the soldering iron 50 is desirably coated with a flux.

When the soldering iron 50 is moved, the solder residue 31 is heated by the soldering iron 50 to melt, thereby spreading over the soldering iron 50 and lands 33. In FIG. 8B, for simplicity, the solder spreading over the soldering iron 50 is not shown. However, due to the surface tension of the solder, the solder stops spreading with a predetermined amount of solder remaining on the lands 33 of the wiring board 30 (see FIG. 8C). It was confirmed that the soldering iron 50 is preferably moved at such a speed as to pass by the lands 33 at about 1/10 to about 1 second.

Although the soldering iron 50 is manually moved in the present embodiment, it may be automatically moved by an apparatus (described later) according to the present invention.

As described above, in the case where the solder residue 31 is scraped by manually moving the soldering iron 50 to be shaped, it is required to consider a land diameter $L_D$. More specifically, depending upon the size the land diameter $L_D$ of the wiring board 30, such a shaping method causes variation or the like of the solder residue 31, resulting in an undesirable state. A preferable range of the land diameter $L_D$ will be described below.

Figure 9A:
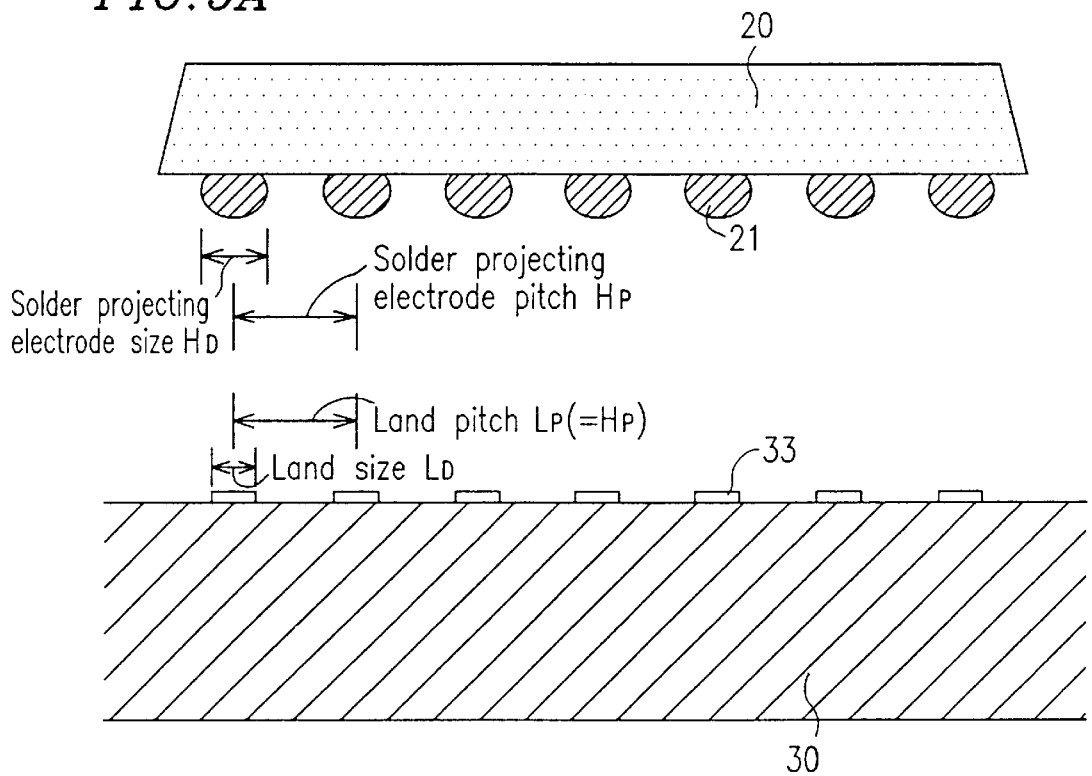
FIGS. 9A and 9B respectively show a semiconductor device and a wiring board to which the present invention is applied.
Figure 9B:
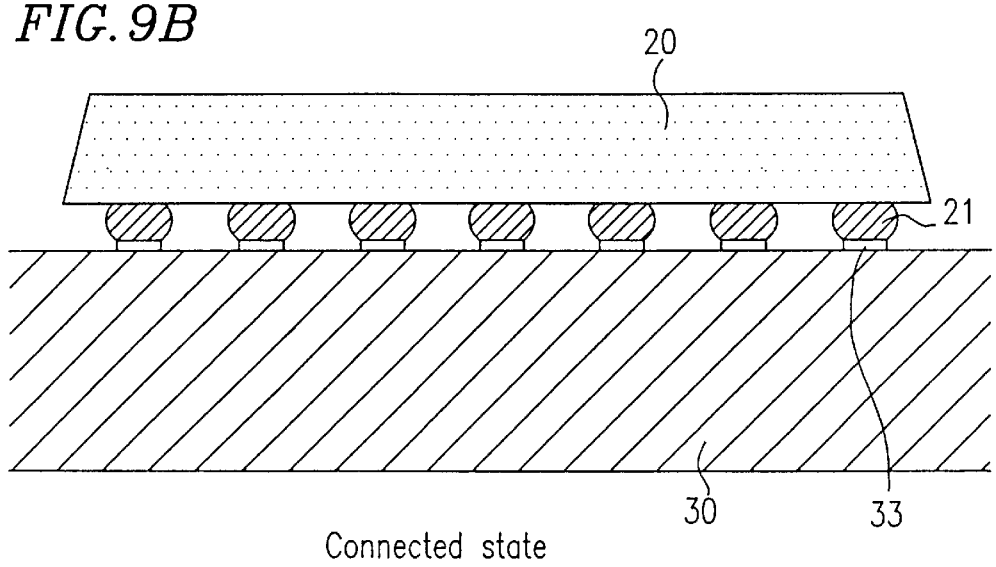

Referring to FIGS. 9A and 9B, a solder projecting electrode size $H_D$ of a semiconductor device 20, a solder projecting electrode pitch $H_P$ thereof, and a land pitch $L_P$ of a wiring board 30 (same as the solder projecting electrode pitch $H_P$) will be described.

The solder projecting electrode size $H_D$ is about 0.2 mm$\phi$ to about 0.8 mm$\phi$ and the solder projecting electrode pitch $H_P$ and the land pitch $L_P$ of the wiring board 30 are respectively about 0.5 mm to about 1.27 mm.

Figure 10:
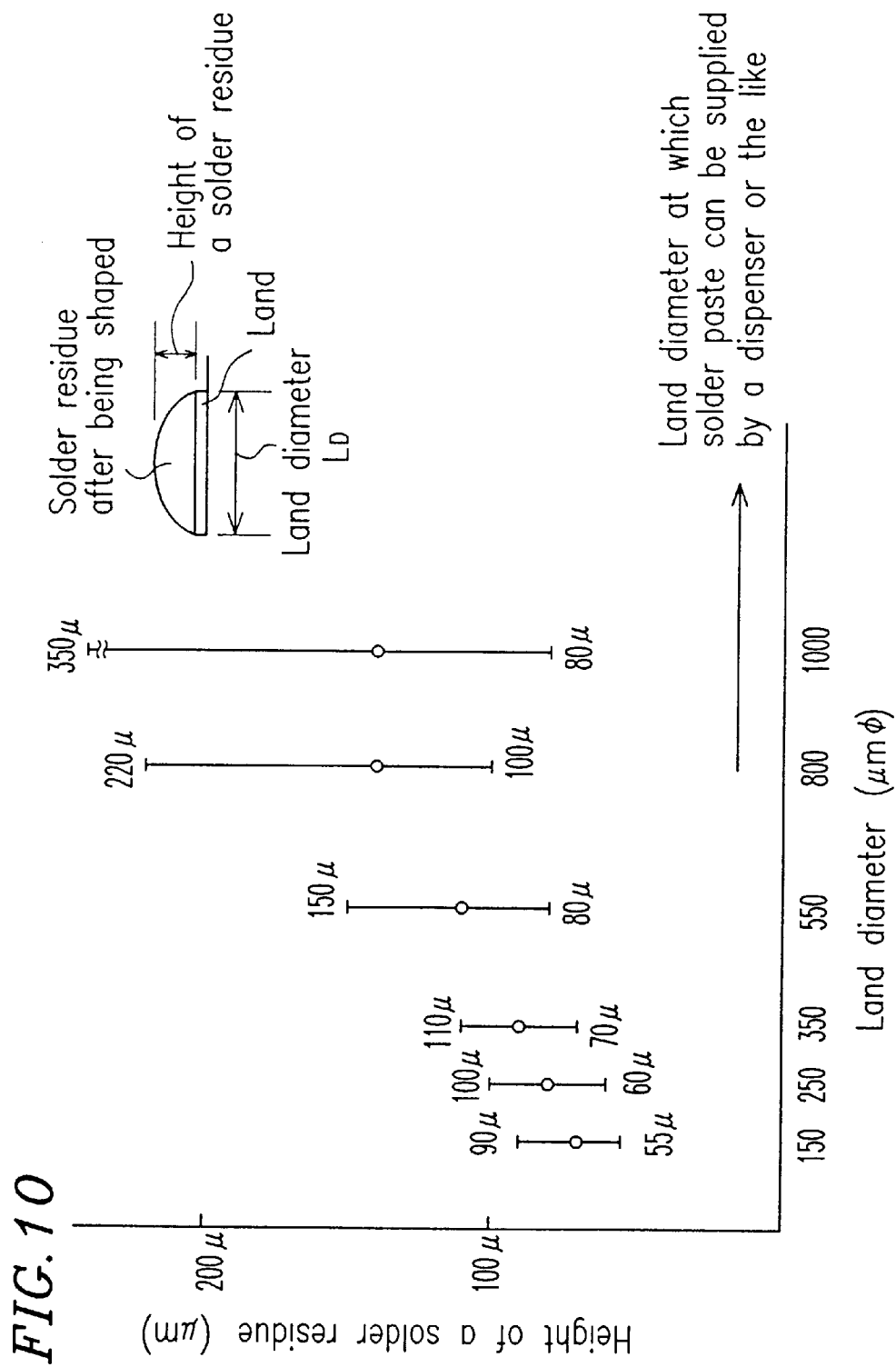
FIG. 10 is a graph illustrating a range of a land diameter of a wiring board to which the present is applied.

An experiment was conducted using the semiconductor device 20 and the wiring board 30 in the above-mentioned ranges. FIG. 10 shows the result.

The preferable height of the solder residue after being shaped varies depending upon the land diameter $L_D$ (for example, as shown in FIG. 10, the preferable height of the solder residue in the case of the land diameter $L_D$ of about 150 $\mu$m$\phi$ is about 55 $\mu$m to about 90 $\mu$m; and the preferable height of the solder residue in the case of the land diameter $L_D$ of about 250 $\mu$m$\phi$ is about 60 $\mu$m to about 100 $\mu$m). According to the experimental result, the preferable land diameter $L_D$ was confirmed to be in the range of about 150 $\mu$m$\phi$ to about 550 $\mu$m$\phi$.

With the wiring board 30 having a land diameter $L_D$ of about 800 $\mu$m$\phi$ or more, it is not preferable to shape the solder residue 31 by scraping it with a soldering iron. It was confirmed that dispensing solder paste is preferable in this case. When the land diameter $L_D$ exceeds about 1 mm$\phi$, the minimum value of the distribution of the solder residue 31 tends to decrease and the variation thereof tends to increase. Thus, it was confirmed that the land diameter exceeding about 1 mm$\phi$ is not preferable.

Embodiment 3

Embodiment 1 adopts a process for transferring solder paste to the solder projecting electrodes 21 of the new semiconductor device 20, thereby increasing the height of the connecting portions. However, depending upon the kinds of products (i.e., the kinds of the semiconductor device 20 and the wiring board 30 to be connected), such a transfer step is not required. More specifically, a repair method omitting Step S5 (transfer step) in Embodiment 1 can be performed.

According to the experimental results of the inventors of the present invention, for example, in the case where the semiconductor device 20 having a land pitch $L_P$ of about 0.6 mm is mounted on the wiring board 30 having a land diameter $L_D$ of about 200 $\mu$m$\phi$, the height of the printed solder (i.e., height of the solder residue after being shaped) is about 70 $\mu$m$\phi$. Therefore, as is understood from FIG. 10, it was confirmed that a reliable repair step can be performed even without performing Step S5.

The following Table 1 shows a test result of temperature cycle reliability evaluation of a semiconductor device repaired in accordance with the method of the present invention and of a semiconductor device which is not defective. The land pitch of the semiconductor device used herein was 0.6 mm. It was confirmed that the repaired semiconductor device has the same reliability as that of the device which is not defective.

TABLE 1

| | Temperature cycle reliability evaluation | | |
| --- | --- | --- | --- |
| | Initial | 100 | 200 |
| 0.6 mm pitch semiconductor device which is not defective | Good | Good | Poor |
| 0.6 mm pitch semiconductor device which has been repaired | Good | Good | Poor |

The following Table 2 shows a comparison result of the occurrence of disconnection in a semiconductor device which has been repaired in accordance with the present invention and a semiconductor device which has been repaired by the conventional repair method (i.e., a semiconductor device which has been repaired by completely removing a solder residue without transferring solder paste). The land pitch of the semiconductor device used herein was 0.8 mm.

TABLE 2

| Temperature cycle | 100 | 200 | 300 | 400 | 500 |
|---|---|---|---|---|---|
| Method of Present Invention | Good | Good | Good | Good | Good |
| Conventional method | 4/5 poor | 5/5 poor | | | |

As is understood from Table 2, according to the method of the present invention, a connection failure which would occur according to the conventional method can be completely eliminated.

The experiment according to the present invention was conducted as follows:

The wiring board 30 including the lands with a land diameter $L_D$ of about 0.3 mm$\phi$ was used. The lands were coated with about 2 to about 3 $\mu$m of electroless Ni plating and flush Au plating.

As the IR lamp, a near-infrared lamp with a power of 225 watts made of tungsten filaments produced by Phoenix Elect. was used. Light emitted by the IR lamp was condensed by a parabolic mirror so as to have a focal point in the vicinity of the surface of the wiring board and the semiconductor device. The semiconductor device was heated to 250° C. by the IR lamp in about one minute.

Solder paste (RMA501-88-3-30, produced by Alphametals Co., Ltd.) having a viscosity of 300,000 centipoises (cP) was used in the experiment, which was obtained by kneading minute solder powders (average size: 30 $\mu$m) of eutectic solder (Sn 63% and Pb 37%) with a RMA type flux.

Figure 2B:
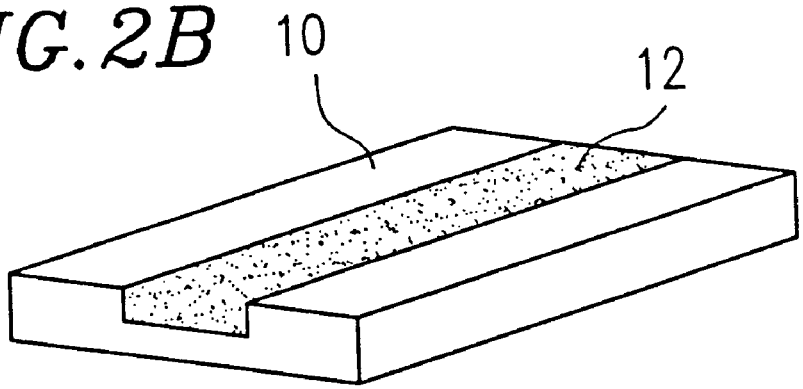
FIG. 2B is a perspective view showing a state in which the jig is filled with transfer paste.

The solder paste was placed in the jig 10 shown in FIGS. 2A and 2B which was obtained by forming a groove with a depth of about 150 $\mu$m in an SUS 301 plate (thickness: about 6 mm) by milling. The solder paste was squeegeed with a glass plate (7027, produced by Corning) having a thickness of about 1.1 mm so as to be flattened in the groove.

The semiconductor device 20 was attached to a vacuum pincette (392, produced by Hakko Kinzoku Co., Ltd.). The semiconductor device 20 was manually pressed against the solder paste flattened to a thickness of about 50 $\mu$m. The semiconductor device 20 was allowed to stand for at least 2 minutes so as to be intimately contacted by the solder paste.

The solder residue was removed by using the jig 40 in which four female threads (ISO·M2 threads) are provided on a brass plate (thickness: about 1.0 mm) so as to allow tip ends thereof to project from the brass plate by about 0.1 mm to form pins 42 (see FIG. 6). The brass plate was thinly soldered by a dip soldering method. The soldered brass plate was further coated with a flux (RF-350-RMA, produced by Nihon Alumit Co., Ltd.) by a brush.

The jig 40 was placed over the solder residue and heated by the IR lamp at about 1225 watts/min. The solder residue assumed a shape of a hill such as shown in FIGS. 7C and 8C with a thickness of about 50 to about 70 $\mu$m.

Instead of using the jig 40, a flux (RF-350-RMA) was coated onto the solder residue by a brush, and the solder residue was rubbed with a soldering iron (926M, produced by Hakko Kinzoku Co., Ltd.) having an iron tip (900M-TI-C) at 300° C. to 320° C. In this case, the solder residue similar to the above was also obtained.

The semiconductor device 20 to which the solder paste has been transferred was attached to a vacuum pincette and placed on the wiring board 30 by visual alignment marks.

The semiconductor device 20 placed on the wiring board 30 was heated by the IR lamp so as to allow the solder residue, the solder projecting electrodes 21 and the transferred solder paste to melt. Thus, the semiconductor device 20 was connected to the wiring board 30. When the solder melts, it returns to a normal position due to the surface tension even if it is displaced (self-alignment effect). Therefore, in the case of lands with a diameter of about 0.3 mm, the lands can be adjusted by up to about ±0.15 mm. Because of this, it was confirmed that the semiconductor device 20 was able to be mounted on the wiring board 30 by visual alignment.

Embodiment 4

Figure 11:
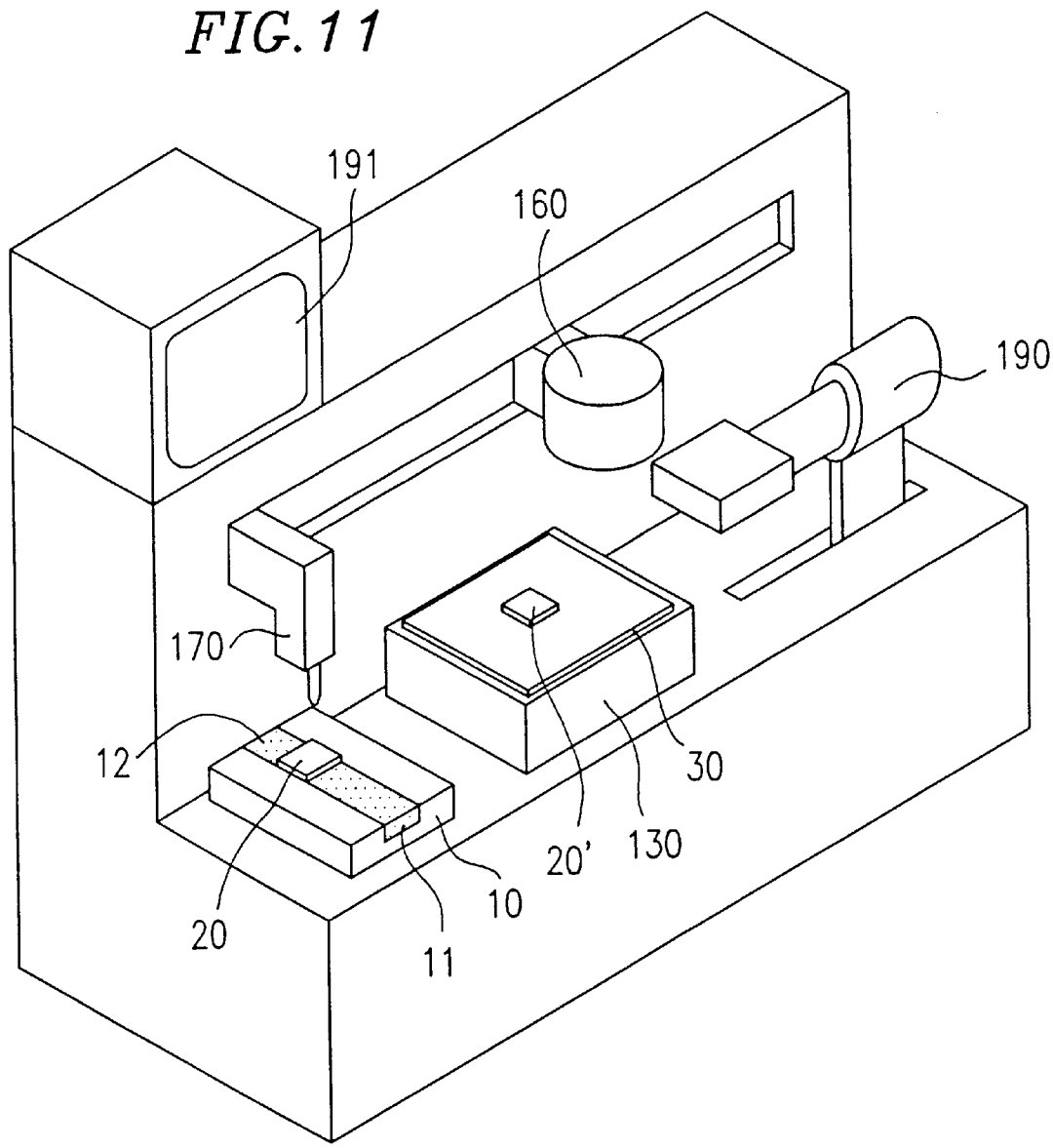
FIG. 11 is a perspective view of an apparatus for producing an electronic circuit device according to the present invention.

FIG. 11 shows an apparatus for producing an electronic circuit device in Embodiment 4 according to the present invention. The apparatus includes a substrate stage 130 which holds a wiring board 30 and is capable of precisely moving for alignment, a solder paste transfer jig 10, a heating lamp 160 (IR lamp) for removing a defective semiconductor device 20', making a solder residue uniform, and mounting a new semiconductor device 20, a pickup tool 170 for holding and moving the semiconductor device 20, an optical system 190 for alignment, and a monitor TV 191 for confirming alignment.

The pickup tool 170, the heating lamp 160, and the optical system 190 for alignment can be moved horizontally. They can be moved, for example, by a linear motor (not shown).

In the above-mentioned apparatus, during the repair step, the lamp 160 is moved onto the defective semiconductor device 20'. The lamp 160 is lit up to heat the defective semiconductor device 20'. As a result, the solder of the connecting portions is heated to melt, which enables the defective semiconductor device 20' to be removed.

Next, the pickup tool 170 is moved to be positioned above the defective semiconductor device 20' and attaches to it, whereby the defective semiconductor device 20' is removed. The above-mentioned jig 40 is placed over the solder residue 31 remaining on the wiring board 30 and heated by the lamp 160, whereby the solder residue is made uniform.

Next, the new semiconductor device 20 is attached to the pickup tool 170. At this time, solder paste 12 is placed in the groove 11 of the solder paste transfer jig 10 and flattened with a squeegee or the like. The semiconductor device 20 attached to the pickup tool 170 is pressed against the groove 11 of the solder paste transfer jig 10 filled with the solder paste 12, whereby the solder paste 12 is transferred to tip ends of the solder projecting electrodes 21 of the semiconductor device 20.

Then, the pickup tool 170 is moved to be positioned above the wiring board 30, attaching to the semiconductor device 20. Using the optical system 190 for alignment and the monitor TV 191 for confirming alignment, the substrate stage 130 is moved so as to align the wiring board 30 with the semiconductor device 20, whereby the semiconductor device 20 is mounted on the wiring board 30. Thereafter, the semiconductor device 20 is heated by the lamp 160, thereby heating and melting the solder to connect the semiconductor device 20 with the wiring board 30.

Embodiment 5

Figure 12:
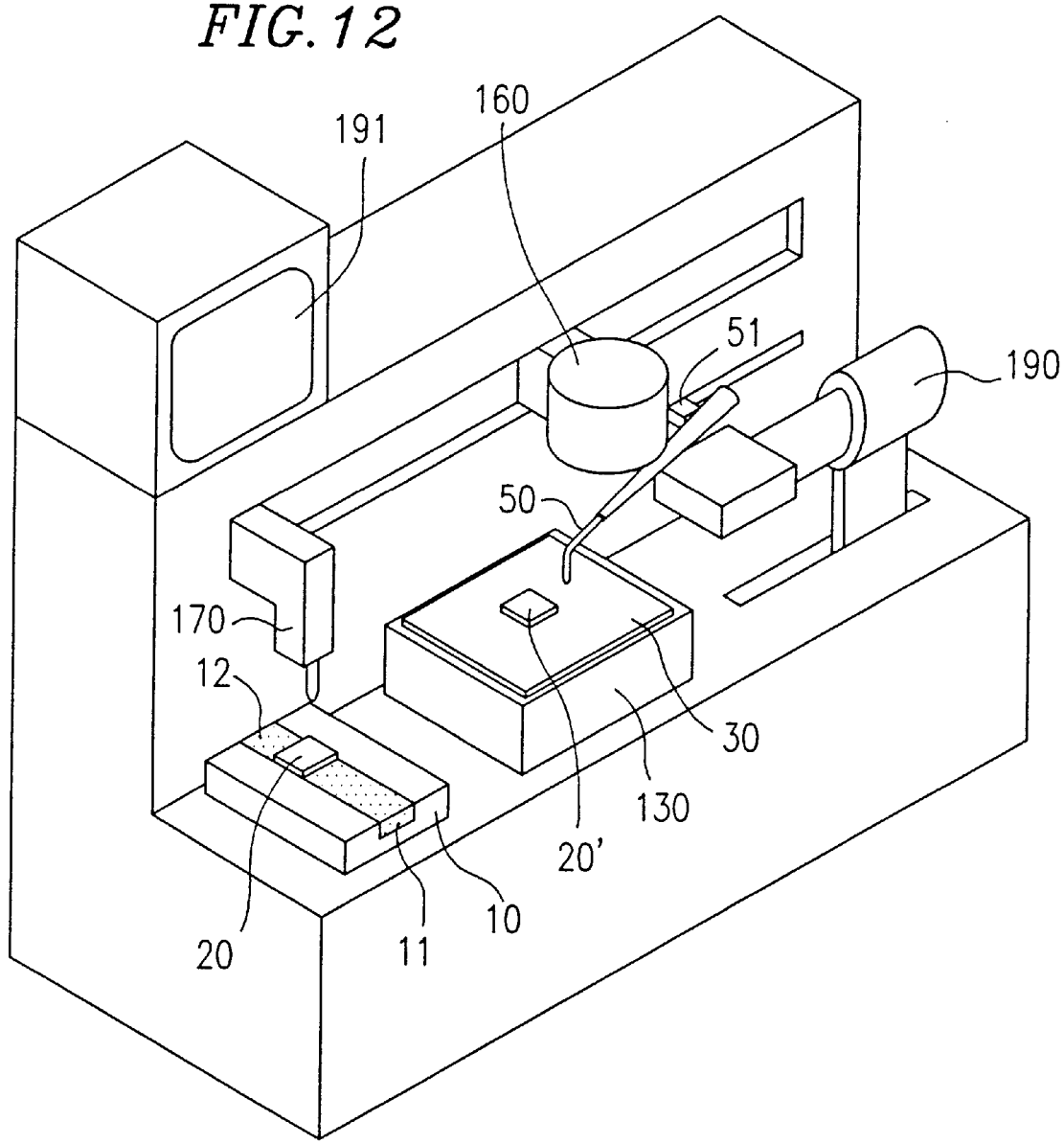
FIG. 12 is a perspective view of another apparatus for producing an electronic circuit device according to the present invention.
Figure 13:
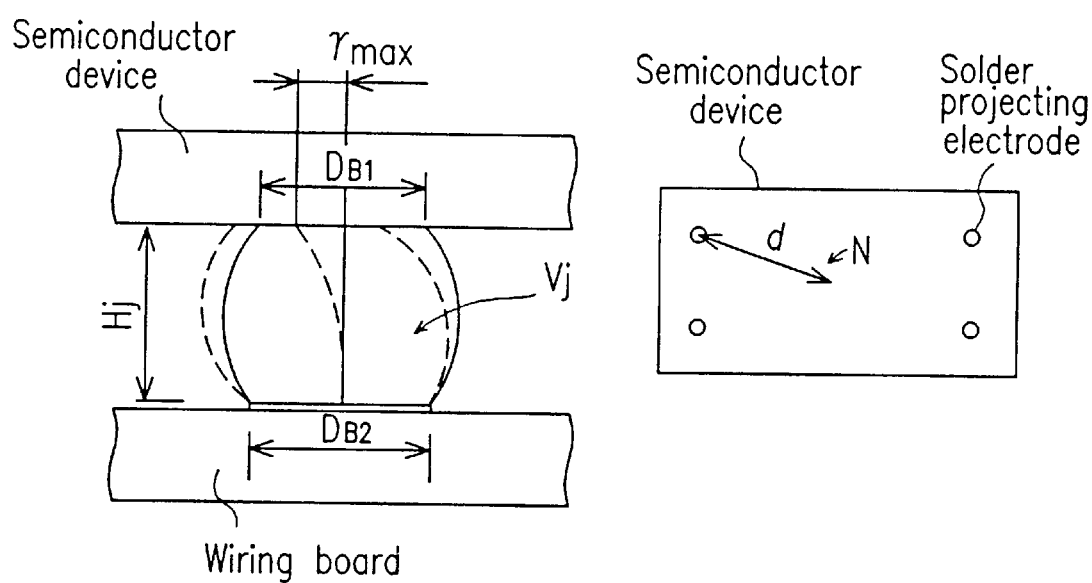
FIG. 13 illustrates the Coffin·Manson connection fatigue life expression.

FIG. 12 shows an apparatus for producing an electronic circuit device in Embodiment 5 according to the present invention. This apparatus is different from that in Embodiment 4 only in that a soldering iron 50 and a movement mechanism 51 for horizontally moving the soldering iron 50 are provided. Therefore, like reference numerals refer to like parts. The description of the parts which have been described in Embodiment 4 will be omitted here. The movement mechanism 51 is operated, for example, by a linear motor.

In the apparatus of the present embodiment, during the repair step, the lamp 160 is moved to be positioned above the defective semiconductor device 20' and heats it, whereby the solder of the connecting portions is heated to melt. The pickup tool 170 is moved to be positioned above the defective semiconductor device 20' and attaches to it, whereby the defective semiconductor device 20' is removed. Then, a soldering iron 50 is brought into contact with the wiring board 30. The movement mechanism 51 is operated under this condition, whereby the solder residue 31 on the wiring board 30 is made uniform.

Next, the new semiconductor device 20 is attached to the pickup tool 170. The semiconductor device 20 is pressed against the groove 11 of the solder paste transfer jig 10 filled with solder paste 12. Thus, the solder paste 12 is transferred to tip ends of the solder projecting electrodes 21 of the semiconductor device 20.

Hereinafter, in the same way as in the above, the wiring board 30 is aligned with the semiconductor device 20, whereby the semiconductor device 20 is mounted on the wiring board 30. Then, the semiconductor device 20 is heated with the lamp 160 so as to be connected with the wiring board 30.

In the apparatus in Embodiment 5, it is critical that the movement mechanism 51 of the soldering iron 50 is in contact with the soldering iron 50. However, since the margin of the movement speed is large, the soldering iron 50 may be manually moved without using the movement mechanism 51. In this case, the apparatus may have the same structure as that in Embodiment 4.

According to the present invention, only a uniform amount of solder residue is left on a wiring board in accordance with the surface tension thereof, and a new semiconductor device is provided with solder paste. Therefore, a sufficient amount of solder can be secured for a repaired semiconductor device. As is understood from the Coffin·Manson connection fatigue life expression, this increases the height $H_j$ of the connecting portions and decreases the maximum strain $\gamma_{max}$ in the connecting portions, so that a connection failure (i.e., disconnection) does not occur. Thus, the reliability of a semiconductor device can be improved.

Depending upon the kinds of products (i.e., kinds of a semiconductor device and a wiring board to be connected), the transfer step as described above is not required.

According to the present invention, the solder residue remaining on the wiring board from which a defective semiconductor device has been removed is left on purpose, instead of being completely removed, whereby a sufficient amount of solder is secured. In this case, the solder residue remaining on the wiring board from which the defective semiconductor device has been removed is left in a nonuniform amount. However, by utilizing the surface tension of the molten solder, the solder residue can be controlled to a uniform amount and a uniform height. This control can be easily performed by heating the solder residue, using the jig for making the solder residue uniform according to the present invention.

According to the transfer method, a uniform amount of solder paste can be easily supplied to the semiconductor device, which is convenient. More specifically, the use of the above-mentioned jig for transferring brazing metal paste facilitates the transfer of solder paste.

In accordance with the Coffin·Manson connection fatigue life expression, in order to increase the height of the connecting portions, solder paste should be transferred as much as possible. Considering the relationship between the amount of the solder residue remaining on the wiring board and the surface tension thereof, the transfer amount is preferably about ⅓ or more of the height of the solder projecting electrodes. If too much amount of solder paste is transferred, a bridge may be formed between the solder projecting electrodes. When such a bridge is formed, the molten solder is integrated due to the surface tension thereof to form a solder projecting electrode having a large diameter. In order to prevent such a solder projecting electrode from being formed, the transfer amount should be limited to about ½ of the height of the solder projecting electrodes, i.e., a value not exceeding an equator surface of the solder projecting electrodes.

According to the present invention, the depth of the groove of the jig for transferring brazing metal paste is prescribed to be about ½ to about ⅓ of the height of the solder projecting electrodes, whereby the transfer amount is prescribed to be about ½ to about ⅓ of the height of the solder projecting electrodes.

A heating device for re-connecting a new semiconductor device to the wiring board should not involve any excessive external force. More specifically, without an excessive external force, the semiconductor device and the wiring board which have been aligned with each other will not be shifted in position. Thus, the repair step can be more easily and efficiently performed. Because of this, according to the present invention, a lamp which does not involve an external force is used. As the lamp, a near-infrared lamp (IR lamp) is preferably used for the following reason. In a semiconductor device, Si is used as a material of choice for a circuit board. Si transmits light in a near-infrared region (wavelength: about 1 to about 5 $\mu$m). When the light with a wavelength of about 1 to about 5 $\mu$m is used, the light passes th rough Si to directly heat solder projecting electrodes and solder paste with efficiency. Thus, the IR lamp which is capable of emitting light with a wavelength of about 1 to about 5 $\mu$m is preferably used.

The use of eutectic solder or eutectic solder with a slight amount of additive added thereto as brazing metal can improve solder strength.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A jig for making a solder residue uniform used for producing an electronic circuit device which, by being heated, removes an excessive residue of a brazing metal residue remaining on lands of the substrate and leaving a uniform amount of the brazing metal residue on the lands, and which is arranged above the lands of the substrate for mounting a semiconductor device, on which the brazing metal residue exist, comprising:

a plate, and a plurality of pins on an outer peripheral portion of the plate.

2. An apparatus for producing an electronic circuit device by aligning projecting electrodes made of brazing metal and formed on one principal plane of a semiconductor device with a substrate for mounting a semiconductor device having lands for connection corresponding to the projecting electrodes, and melting the projecting electrodes by heating, thereby mounting the semiconductor device on the substrate, wherein, in a case where the semiconductor device once mounted is defective, the defective semiconductor device is removed from the substrate and a new semiconductor device is mounted on the substrate, the apparatus comprising:
a holder holding the substrate;
a holder holding the defective semiconductor device or the new semiconductor device;
an alignment unit aligning the substrate with the defective semiconductor device or the new semiconductor device;
a unit removing an excessive residue of a brazing metal residue remaining on connecting portions of the substrate from which the defective semiconductor device has been removed and leaving a uniform amount of the brazing metal residue corresponding to surface tension of the brazing metal residue on the connecting portions; and
a heating unit melting the projecting electrodes of the aligned new semiconductor device by heating, thereby connecting the new semiconductor device to the substrate.

3. An apparatus for producing an electronic circuit device according to claim 2, wherein the unit removing an excessive residue of brazing metal residue remaining on connecting portions of the substrate from which the defective semiconductor device has been removed and leaving a uniform amount of the brazing metal reside on the connecting portions is a heating iron which moves at a predetermined speed while keeping in contact with the brazing metal residue for making a solder residue uniform, and moving means to move a heating iron at a predetermined speed.

4. An apparatus for producing an electronic circuit device according to claim 2, wherein the heating unit is a near-infrared lamp.

5. An apparatus for producing an electronic circuit device by aligning projecting electrodes made of brazing metal and formed on one principal plane of a semiconductor device with a substrate for mounting a semiconductor device having lands for connection corresponding to the projecting electrodes, and melting the projecting electrodes by heating, thereby mounting the semiconductor device on the substrate, wherein, in a case where the semiconductor device once mounted is defective, the defective semiconductor device is removed from the substrate and a new semiconductor device is mounted on the substrate, the apparatus comprising:
a holder holding the substrate;
a holder holding the defective semiconductor device or the new semiconductor device;
an alignment unit aligning the substrate with the defective semiconductor device or the new semiconductor device;
a unit removing an excessive residue of a brazing metal residue remaining on connecting portions of the substrate from which the defective semiconductor device has been removed and leaving a uniform amount of the brazing metal residue corresponding to surface tension of the brazing metal residue on the connecting portions;
a jig for transferring brazing metal paste to tip ends of the projecting electrodes of the new semiconductor device, a groove in a shape of an expanding slot or a circular concave groove being formed in a center portion of the jig, and a depth of the groove being prescribed to be about $\frac{1}{3}$ to about $\frac{1}{2}$ of a height of the projecting electrodes of the semiconductor device; and
a heating unit melting the projecting electrodes of the aligned new semiconductor device by heating, thereby connecting the new semiconductor device to the substrate.

6. An apparatus for producing an electronic circuit device according to claim 5, wherein the unit removing an excessive residue of a brazing metal residue remaining on connecting portions of the substrate from which the defective semiconductor device has been removed and leaving a uniform amount of the brazing metal residue on the connecting portions is a heating iron which moves at a predetermined speed while keeping in contact with the brazing metal residue or a jig for making a solder residue uniform including a plurality of pins on an outer peripheral portion, and moving means to move the heating iron at a predetermined speed.

7. An apparatus for producing an electronic circuit device according to claim 5, wherein the heating unit is a near-infrared lamp.

8. The jig according to claim 1, wherein the metal plate is rectangular and is solder-wettable.

9. The jig according to claim 8, wherein the metal plate has a composition and size to pass sufficient heat from a first side to a second side to melt solder.

10. An apparatus for producing an electronic circuit device according to claim 2, wherein the unit removing an excessive residue of brazing metal residue remaining on connecting portions of the substrate from which the defective semiconductor device has been removed and leaving a uniform amount of the brazing metal reside on the connecting portions is a jig for making a solder residue uniform the jig including a plurality of pins on an outer peripheral portion of the jig.

11. The apparatus according to claim 10, wherein the jig is a metal plate.

12. An apparatus for producing an electronic circuit device according to claim 5, wherein the groove is a circular groove.

13. A jig for making a solder residue uniform according to claim 1, wherein a surface of the plate on which the pins are provided is formed with a solder-wettable material.

14. A jig for making a solder residue uniform according to claim 1, wherein the heights of the pins are about $\frac{1}{4}$ to about $\frac{1}{10}$ of a land diameter of the lands.

15. The apparatus according to claim 2, wherein the means for removing the brazing metal is placed with a predetermined gap kept from the surface of the connecting portion, which can leave a uniform amount of brazing metal on the connecting portion by the surface tension of the brazing metal.

16. The apparatus according to claim 15, wherein the predetermined gap is about $\frac{1}{4}$ to about $\frac{1}{10}$ of a land diameter of the lands.

17. The apparatus according to claim 3, wherein the heating iron is moved at such a speed so as to pass by the lands at about $\frac{1}{10}$ to about 1 second.

18. The apparatus according to claim 5, wherein the means for removing the brazing metal is placed with a predetermined gap kept from the surface of the connecting portion, which can leave a uniform amount of brazing metal on the connecting portion by the surface tension of the brazing metal.

19. The apparatus according to claim 18, wherein the predetermined gap is about $\frac{1}{4}$ to $\frac{1}{10}$ of a land diameter of the lands.

20. The apparatus according to claim 6, wherein the heating iron is moved at such a speed as to pass by the lands at about $\frac{1}{10}$ to about 1 second.

* * * * *